(12) United States Patent
Tertinek (10) Patent No.: US 11,133,809 B2
(45) Date of Patent: Sep. 28, 2021

(54) METHOD AND CIRCUIT FOR DETERMINING PHASE CONTINUITY OF A LOCAL OSCILLATOR SIGNAL, AND LOCAL OSCILLATOR SIGNAL GENERATION CIRCUIT

(71) Applicant: Intel IP Corporation, Santa Clara, CA (US)

(72) Inventor: Stefan Tertinek, Graz (AT)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/641,244

(22) PCT Filed: Sep. 28, 2017

(86) PCT No.: PCT/US2017/053866
§ 371 (c)(1),
(2) Date: Feb. 23, 2020

(87) PCT Pub. No.: WO2019/066835
PCT Pub. Date: Apr. 4, 2019

(65) Prior Publication Data
US 2020/0228125 A1 Jul. 16, 2020

(51) Int. Cl.
| H03L 7/099 | (2006.01) |
| H03L 7/091 | (2006.01) |
| H03L 7/181 | (2006.01) |
| H03L 7/185 | (2006.01) |
| H04B 1/403 | (2015.01) |

(52) U.S. Cl.
CPC .......... *H03L 7/0992* (2013.01); *H03L 7/091* (2013.01); *H03L 7/181* (2013.01); *H03L 7/185* (2013.01); *H04B 1/403* (2013.01)

(58) Field of Classification Search
CPC ....... H03L 7/0992; H03L 7/091; H03L 7/181; H03L 7/185; H03L 2207/50; H03L 7/099; H04B 1/403; H03K 5/26; H03B 21/00
USPC ......................................................... 455/260
See application file for complete search history.

(56) References Cited

U.S. PATENT DOCUMENTS

| 7,962,108 B1 | 6/2011 | Khlat et al. |
| 9,893,875 B2* | 2/2018 | Zanuso ..................... H03L 7/14 |
| 9,998,129 B1* | 6/2018 | Zhuang ................. H03L 7/0992 |
| 2013/0243061 A1* | 9/2013 | Dark ....................... H04B 17/21 375/224 |
| 2014/0247902 A1* | 9/2014 | Dark ........................ H04L 1/248 375/296 |
| 2014/0270032 A1* | 9/2014 | Liu ........................ H04L 7/0331 375/376 |
| 2015/0098714 A1 | 4/2015 | Hatae et al. |
| 2015/0103872 A1 | 4/2015 | Tarighat Mehrabani |

FOREIGN PATENT DOCUMENTS

WO      2012041337 A1      4/2012

* cited by examiner

*Primary Examiner* — Ankur Jain
(74) *Attorney, Agent, or Firm* — 25PL Patent Attorneys PartG mbB; Yong Beom Hwang (57) ABSTRACT

A method for determining phase continuity of a local oscillator signal generated using a frequency divider is provided. The method includes determining at least one sample of the local oscillator signal. Further, the method includes determining information on the phase continuity using the at least one sample.

16 Claims, 8 Drawing Sheets

METHOD AND CIRCUIT FOR DETERMINING PHASE CONTINUITY OF A LOCAL OSCILLATOR SIGNAL, AND LOCAL OSCILLATOR SIGNAL GENERATION CIRCUIT

FIELD

The present disclosure relates to determining virtual phase continuity of Local Oscillator (LO) signals. In particular, examples relate to a method and a circuit for determining phase continuity of a LO signal, and a LO signal generation circuit.

BACKGROUND

Radio Frequency (RF) transceivers integrate several (Digital) Phase-Locked Loops ((D)PLL) to generate on-chip LO signals for transmission and reception of RF signals. One requirement on the LO signals is virtual phase continuity, i.e. the phase of the LO signal should remain virtually continuous during power-down/up cycles of transmit and/or receive chains (e.g. including DPLLs).

Commonly, a high frequency oscillation signal is divided by means of a frequency divider in order to obtain a LO signal at a desired frequency. Frequency dividers are commonly designed at very high frequency and may, hence, have no static reset. As a consequence, when a frequency divider is powered-up, the phase of the output LO signal is random. For example, if the frequency divider divides the frequency by two, the phase of the input high frequency oscillation signal is known but the phase of the LO signal output by the frequency divider is unknown and may have a phase uncertainty of 180°. The phase uncertainty of this LO signal may be the main obstacle for achieving virtual phase continuity.

Hence, there may be a desire for LO phase continuity detection.

BRIEF DESCRIPTION OF THE FIGURES

Some examples of apparatuses and/or methods will be described in the following by way of example only, and with reference to the accompanying figures, in which.

DETAILED DESCRIPTION

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e. only A, only B as well as A and B. An alternative wording for the same combinations is "at least one of A and B". The same applies for combinations of more than 2 Elements.

The terminology used herein for the purpose of describing particular examples is not intended to be limiting for further examples. Whenever a singular form such as "a," "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

Figure 1:
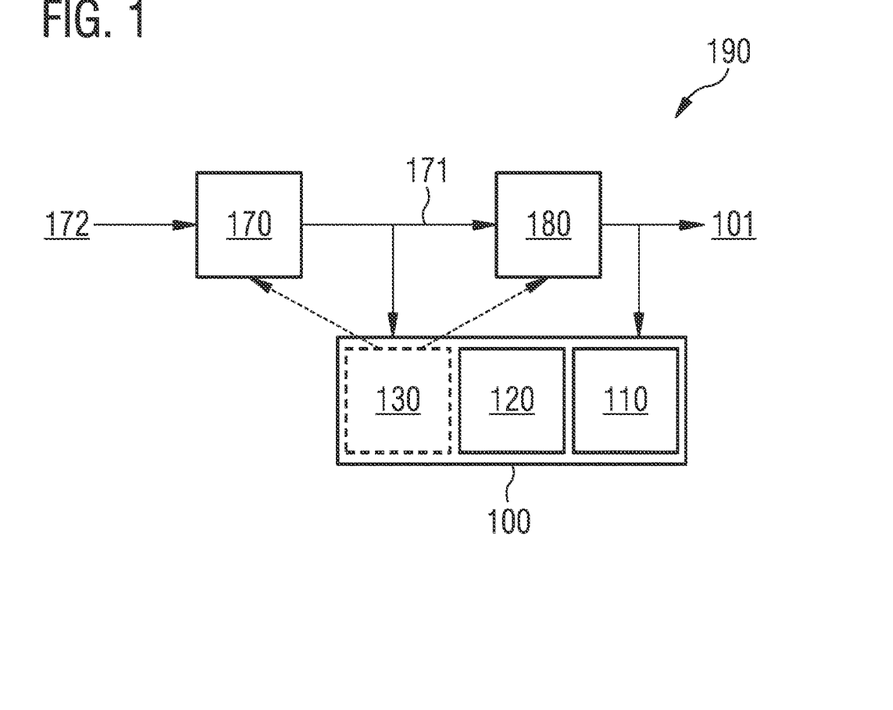
FIG. 1 illustrates an example of a LO signal generation circuit using an example of a circuit for determining phase continuity of a LO signal.

FIG. 1 illustrates a LO signal generation circuit 190 for generating a LO signal. The LO signal generation circuit 190 comprises a PLL 170 (e.g. a DPLL) configured to generated a PLL signal 171 (i.e. an oscillation signal). For example, the PLL 170 may generate the PLL signal 171 based on a reference oscillation signal 172 from a reference source (e.g. a quartz, not illustrated). Moreover, the LO signal generation circuit 190 comprises a frequency divider 180 configured to receive the PLL signal 171 and to divide the frequency of the PLL signal 171 in order to generate a local oscillator signal 101.

For example, the LO signal generation circuit 190 may be used in a mobile communications device or any other electronic circuitry requiring a LO signal. During operation, the LO signal generation circuit 190 may be (repeatedly) powered-down and powered-up. In many applications, it is desired (required) that the phase of the local oscillator signal 101 is virtually continuous during a power-down/power-up cycle. That is, after power-up of the frequency divider 180, the phase of local oscillator signal 101 shall be defined (known) but not be random after a predefined (fixed) lapse of time after power-up of the frequency divider 180.

As described above, the PLL 170 may generate the PLL signal 171 based on the known reference oscillation signal 172. Accordingly, the PLL signal 171 is locked to the reference oscillation signal 172 after a lapse of time after power-up of the LO signal generation circuit 190. This will become more evident from FIG. 2.

Figure 2:
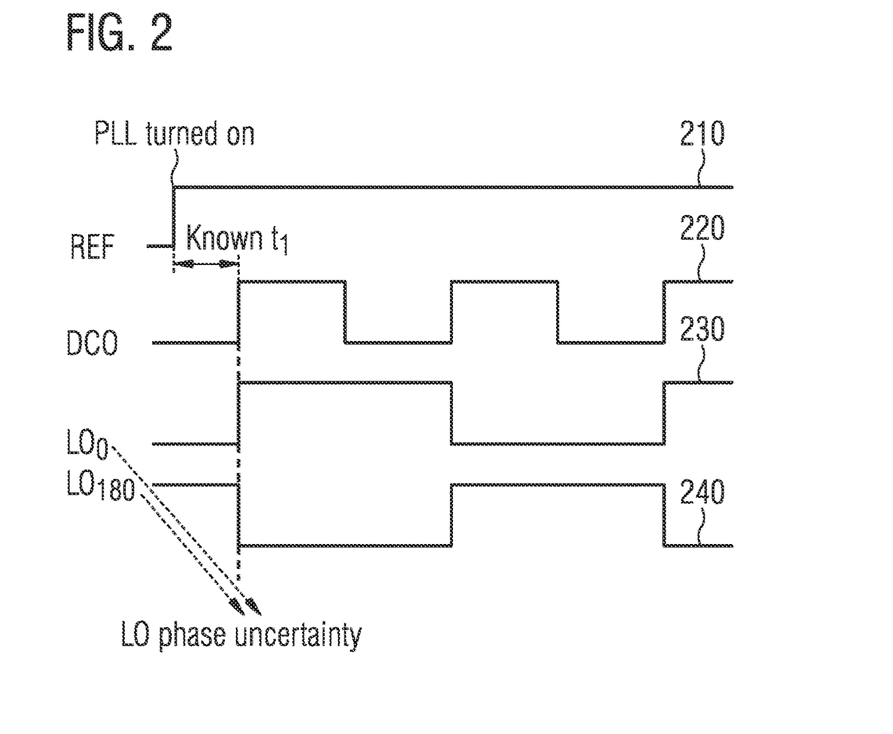
FIG. 2 illustrates an example of a timing diagram.

FIG. 2 illustrates a timing diagram representing the temporal course of signals within the LO signal generation circuit 190. The uppermost signal course 210 illustrates the state of the PLL 170, i.e. the signal course 210 illustrates if the PLL 170 is on or off (low signal relates to off-state, whereas high signal relates to on-state). The PLL 170 is powered-up synchronously with the reference oscillation signal 172 of the reference source. After a fixed lapse of time after power-up, a controlled oscillator (e.g. a Digitally Controlled Oscillator, DCO, or a Voltage Controlled Oscillator, VCO) of the PLL 170 is phase-locked to the reference oscillation signal 172 of the reference source. This is illustrated in FIG. 2 by means of signal course 220 representing the temporal course of the PLL signal 171. After a fixed, known time $t_1$ after power-up of the PLL 170, the PLL signal 171 is locked. For example, this may be achieved by initializing a multi-stage noise shaper within the PLL 170 always with the same value. Alternatively, this may be achieved by connecting a running multi-stage noise shaper to a multi-modulus divider within the PLL 170. Accordingly, the PLL signal 171 has a certain known phase.

On the contrary, the frequency divider 180 does not have a static reset since frequency dividers are designed at very high frequency. Accordingly, the phase of the LO signal 101 is random. In the timing diagram of FIG. 2, it is assumed for illustrative purposes that the frequency divider 180 divides the frequency of the PLL signal 171 by two. However, it is to be noted that the frequency divider 180 may alternatively divide the frequency of the PLL signal 171 by any other integer (e.g. three, four, eight or sixteen). The resulting phase uncertainty is indicated in FIG. 2 by signal courses 230 and 240 representing possible phase positions of the LO signal 101. It is evident from both signal courses 230 and 240 that the frequency of the LO signal 101 is halve of the frequency of PLL signal 171. However, the signal courses 230 and 240 are phase shifted by 180° with respect to each other. It is to be noted that for a frequency divider dividing the frequency of an input oscillation signal by n, the phase of the resulting LO signal may be phase shifted by m*360°/n, with m and n being integers and m being smaller than n.

As a consequence of the phase uncertainty, it is unknown if a phase jump (of e.g. 180°) of the LO signal 101 is present or not after a power-down/power-up cycle of the LO signal generation circuit 190. That is, it is unknown if there is virtual phase continuity during the power-down/power-up cycle (virtual since no LO signal is generated during power-down of the LO signal generation circuit 190).

In order to determine phase continuity of the LO signal 101, the LO signal generation circuit 190 further comprises a circuit 100 for determining phase continuity of a LO signal generated using a frequency divider. For example, the circuit 100 may be coupled to an output of the PLL 170 and to an output of the frequency divider 180. The circuit 100 comprises a sampling circuit 110 configured to determine at least one sample of the LO signal 101. Therefore, the sampling circuit 110 may be coupled to the output of the frequency divider 180.

For example, the sampling circuit 110 may sample the LO signal 101 at a predetermined time after the PLL 170 is switched on. The predetermined time may be greater than the time required by the PLL 170 for locking the phase of the PLL signal 171 to the reference oscillation signal 172. For example, the predetermined time after the PLL 170 is switched on may be defined with respect to the PLL signal 171. The sampling circuit 110 may, e.g., sample the LO signal 101 at a fixed predetermined time interval after a signal edge (rising or falling edge) of the PLL signal 171 occurs. In this respect, the fixed predetermined time interval is shorter than a full cycle time of the PLL signal 171.

Further, the circuit 100 comprises an evaluation circuit 120 configured to determine information on the phase continuity using the at least one sample. That is, the evaluation circuit 120 determines the phase continuity of the LO signal 101 based on the at least one sample of the LO signal 101.

The circuit 100, hence, allows to determine phase continuity based on the one or more samples of the LO signal 101. No phase relations between the LO signal 101 and the reference oscillation signal 172 before and after a power-down/power-up cycle need to be measured. Therefore, area expensive circuitry for phase measurement (e.g. a Time-to-Digital Converter, TDC) may be avoided and, hence, an area efficiency of the LO signal generation circuit 190 may be increased. Moreover, no re-design of conventional frequency dividers is required since the circuit 100 may be integrated without interrupting with the frequency divider.

For example, the evaluation circuit 120 may use the at least one sample with information on a reference sample. The reference sample may be related to a previous power-up of the PLL 170 and the frequency divider 180. That is, the reference sample may be determined in the same way as the at least one sample of the LO signal 101 related to the current power-up. If the LO signal 101 is phase continuous, the at least one sample equals the reference sample since no phase shifted occurred and, hence, the LO signal 101 is sampled at the same position after both power-ups (a more detailed explanation will be given with reference to FIG. 4). Accordingly, the evaluation circuit 120 may determine that the LO signal 101 is phase continuous, if the at least one sample equals the reference sample.

The evaluation circuit 120 may save the determined sample as an information on a further reference sample for a subsequent phase continuity determination (i.e. for determining phase continuity after a subsequent power-down/power-up cycle).

Further, the circuit 100 may comprise an additional circuit 130 for correcting the phase of the LO signal 101 if the LO signal 101 is not phase continuous. For example, the circuit 130 may control the PLL 170 to phase shift the PLL signal 171 or control the frequency divider 180 to phase shift the LO signal 101, if the LO signal 101 is not phase continuous. If the frequency divider 180 divides the frequency of the PLL signal 171 by two, the circuit 130 may, e.g., control the frequency divider 180 to shift the phase of the LO signal 101 by 180° in order to generate a corrected LO signal.

In some examples, further samples of the LO signal 101 may be used for determining phase continuity of the LO signal 101. For example, the sampling circuit may determine a further sample of the LO signal 101 after a full cycle time of the PLL signal 171 after the determination of the (at least one) first sample. Accordingly, the evaluation circuit may further determine the information on the phase continuity using the further sample. The number of samples used for determining phase continuity of the LO signal 101 may be based on the ratio of the PLL signal 171's frequency and the LO signal 101's frequency. That is, the number of samples used for determining phase continuity of the LO signal 101 may be based on the integer n used by the frequency divider 180 for frequency division. For example, n−1 samples may be used for determining phase continuity of the LO signal 101 if the frequency divider 180 divides the frequency of the PLL signal 171 by n.

Figure 3:
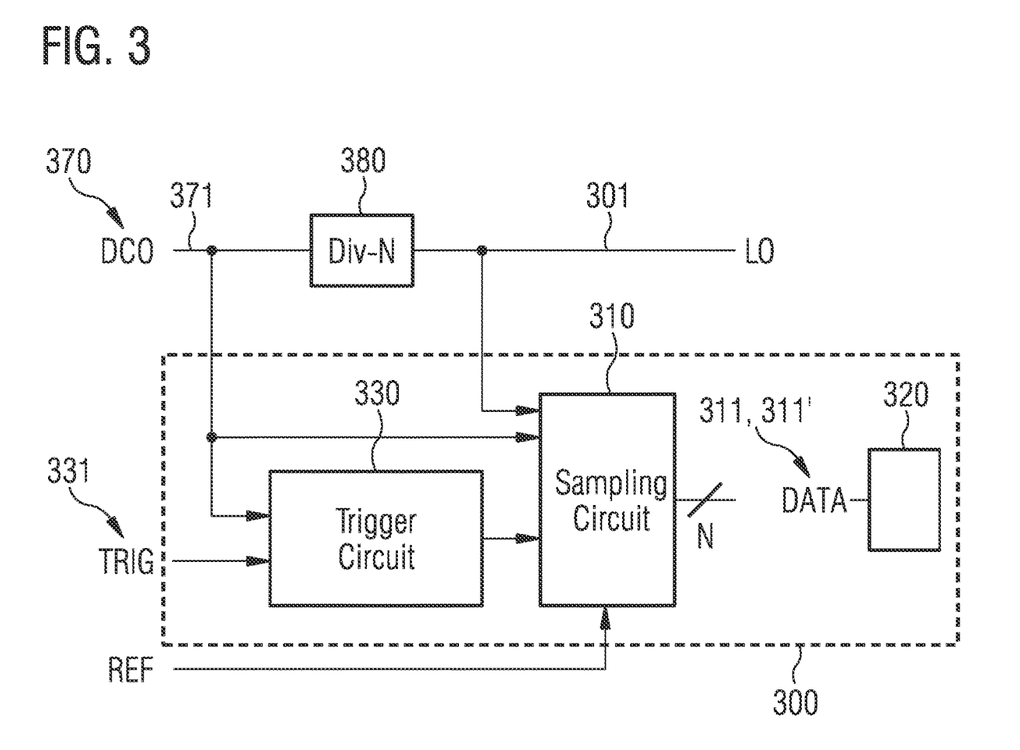
FIG. 3 illustrates another example of a circuit for determining phase continuity of a LO signal.
Figure 4:
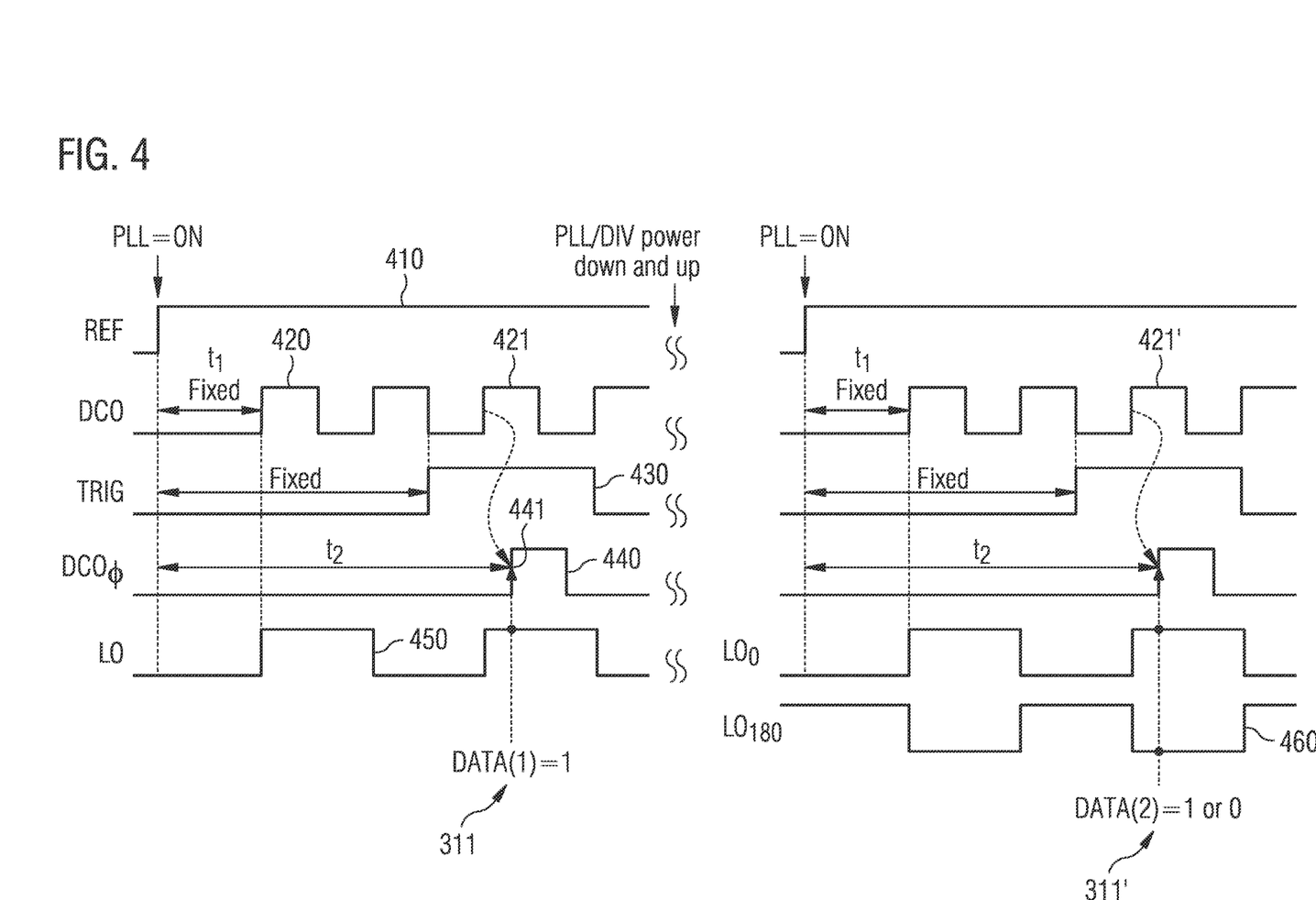
FIG. 4 illustrates another example of a timing diagram.

A more detailed example of a circuit for determining phase continuity of a LO signal generated using a frequency divider is illustrated in FIG. 3 together with the timing diagram of FIG. 4.

As illustrated in FIG. 3, a DCO 370 of a PLL (not illustrated) supplies a PLL signal (oscillation signal) 371 to frequency divider 380. The frequency divider 380 divides the frequency of the PLL signal 371 by an integer n in order to generate LO signal 301 of a desired frequency.

As illustrated in the left part of FIG. 4 by means of signal course 410, during a first powerdown/power-up cycle, the PLL is switched on synchronously with a reference clock (i.e. synchronous with the reference oscillation signal input to the PLL). As discussed above, the PLL (i.e. the DCO 370) is phase-locked to the reference oscillation signal after a fixed time $t_1$ (see the left part of signal course 420 representing the PLL signal 371), whereas the LO signal 301 has a certain unknown phase.

Once the PLL (i.e. the DCO 370) is phase-locked, a trigger signal 331 is generated synchronously with a signal edge of the PLL signal 371 after a fixed time from switching the PLL on. For example, the trigger signal 331 may be synchronized to a falling edge of the PLL signal 371 as illustrated in the left part of signal course 430 representing the trigger signal 331. Alternatively, the trigger signal 331 may be synchronized to a rising edge of the PLL signal 371. Using a different edge of the PLL signal 371 for synchronization merely changes the value of the obtained sample of the LO signal 301 but not the phase continuity detection (since the same edge is used for each power-down/power-up cycle). The PLL signal 371 and the trigger signal 331 are generated at fixed but otherwise arbitrary time offsets with respect to the time instant at which the PLL 370 is switched on in order to avoid phase ambiguities.

As illustrated in FIG. 3, a trigger circuit 330 receives the trigger signal 331 together with the PLL signal 371. The trigger circuit 330 generates a sampling signal 332 based on the trigger signal 331 and the PLL signal 371. For example, the sampling signal 332 may be a delayed replica of the PLL signal 371. The sampling signal 332 is used by sampling circuit 310 to sample the LO signal 301. The temporal course of the sampling signal 332 is illustrated in FIG. 4 by means of signal course 440. It is evident from signal course 440 that the initial signal edge 441 of the sampling signal 332 occurs at a fixed predetermined time interval after a signal edge 421 of the PLL signal 371. The sampling circuit 310 samples the LO signal 331 at the occurrence of the signal edge 441 of the sampling signal 332 as illustrated by means of the signal course 450 in FIG. 4. As a consequence, the sampling circuit 310 samples the LO signal 301 at a predetermined time t2 after the PLL is switched on during the first power-down/power-up cycle. In particular, the sampling circuit 310 samples the LO signal 301 at a fixed predetermined time interval after a signal edge of the PLL signal 371 occurs. In the example of FIG. 4, the LO signal 301 has a value of 1 at the time of sampling. The resulting sample 311 is used as reference sample.

Also, during a subsequent second power-down/power-up cycle, the PLL is switched on synchronously with the reference clock (see right part of signal course 410). The PLL is again locked to the reference oscillation signal after the same fixed time $t_1$ (see the right part of signal course 420 representing the PLL signal 371). Also the trigger signal 331 is again generated synchronously with a signal edge of the PLL signal 371 after the fixed time from switching the PLL on for the second time. Also the sampling signal 332 occurs again at the fixed predetermined time interval after the signal edge 421' of the PLL signal 371. As a consequence, the sampling circuit 310 samples the LO signal 301 again at the predetermined time t2 after the PLL is switched on for the second time during the subsequent powerdown/power-up cycle. However, since the frequency divider 380 does not have a static reset, the phase of the LO signal 301 is random. For example, the phase of the LO signal 301 may be phase shifted by 180° for a frequency division by two as illustrated by signal courses 450 and 460 in the right part of FIG. 4. That is, the resulting sample 311' may be 0 or 1.

Phase continuity is detected by evaluation circuit 320 based on the samples 311 and 311'. That is, the evaluation circuit 320 uses the sample 311' together with information on reference sample 311 for determining phase continuity of the LO signal 301. If sample 311' equals sample 311, the evaluation circuit 320 determines that the LO signal 301 is phase continuous. If sample 311' does not equal sample 311, the evaluation circuit 320 determines that the LO signal 301 is not phase continuous.

If the LO signal 301 is not phase continuous, a required phase correction may be determined and used to correct the phase of the LO signal 301. For example, a phase correction for the LO signal 301 may be determined based on the sample 311 and the sample 311' (i.e. the current sample and the reference sample). For example, the circuit 300 may comprise a circuit (not illustrated) for determining a corrected LO signal.

Figure 5:
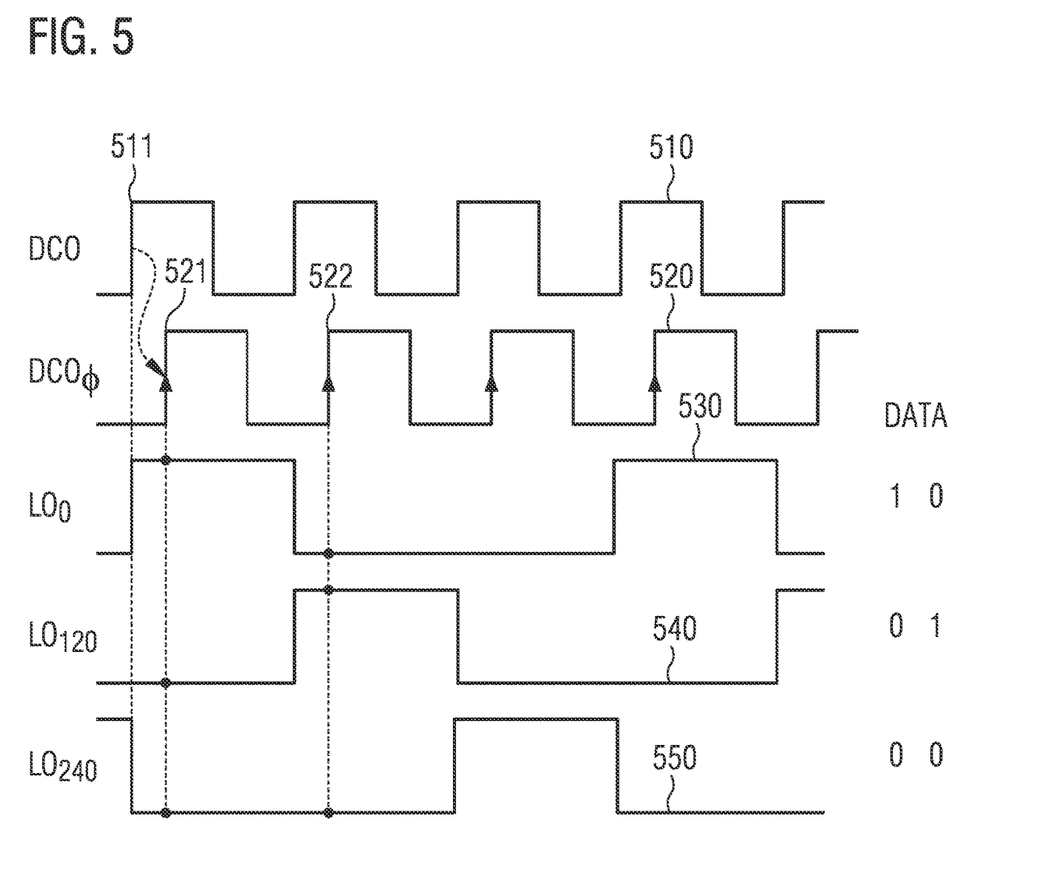
FIG. 5 illustrates still another example of a timing diagram.

In the foregoing description, it was assumed that the frequency divider 380 divides the frequency of the PLL signal 371 by two. However, the frequency divider 380 may divide the frequency of the PLL signal 371 by any integer. A timing diagram for a frequency division by three is illustrated in FIG. 5. Since the frequency divider 380 divides the frequency of the PLL signal 371 by three, the phase of the LO signal 301 may phase shifted by 120° or 240° after the second power-down/power-up cycle compared to the phase position of the LO signal 301 after the first power-down/power-up cycle. This is illustrated in FIG. 5 by signal courses 530, 540 and 550 which illustrate the temporal courses of the LO signal 301 for phase shifts of 0°, 120° and 240°.

In addition to the above described sampling for a frequency division by two, the sampling circuit 310 determines a further (second) sample of the LO signal 301 after a full cycle time of the PLL signal 371 after the determination of the first sample (after switching on the PLL). Signal course 510 in FIG. 5 again illustrates the temporal course of the PLL signal 371. The signal course 520 illustrates the temporal course of the sampling signal 332. It is evident from signal course 520 that the initial rising signal edge 521 of the sampling signal 332 occurs at a fixed predetermined time interval after a signal edge 511 of the PLL signal 371. The next rising signal edge 522 of the sampling signal 332 occurs exactly one full cycle time of the PLL signal 371 later since the sampling signal 332 is a delayed replica of the PLL signal 371. As indicated by signal courses 530, 540 and 550, the sampling circuit 310 samples the LO signal 301 at the occurrence of the rising signal edges 521 and 522 of the sampling signal 332. Depending on the phase of the LO signal 301, the resulting samples of the LO signal 301 have different values. For example, the samples of the LO signal 301 may have the values 1 and 0 for a 0° phase shift, the values 0 and 1 for a 120° phase shift and the values 0 and 0 for a 240° phase shift.

The evaluation circuit 320 determines the information on the phase continuity using both samples, i.e., the first and the second (further) sample of the LO signal 301 after switching on the PLL. By comparing both values to the reference values obtained for the previous power-down/power-up cycle, phase continuity of the LO signal 301 is determined.

In the following, an exemplary implementation of a circuit 600 incorporating the functionalities of a trigger circuit and a sampling circuit according to the proposed technique is described in connection with FIG. 6. Circuit 600 comprises a shift-register with N (high-speed) flip-flop circuits 610-1, 610-2, . . . , 610-N. The number N of flip-flop circuits may be based on the integer n used by the frequency divider for dividing the PLL signal. For example, N may be equal to n−1. The N flip-flop circuits 610-1, 610-2, . . . , 610-N hold consecutive samples taken from LO signal 601 that is input to circuit 600. The N flip-flop circuits 610-1, 610-2, . . . , 610-N are clocked by sampling signal 602. As described above, the sampling signal 602 is a delayed replica of the PLL signal 603 input to the circuit 600. The sampling signal 602 is generated by delaying PLL signal 603 using a delay line 620.

The delay line 620 is controlled based on an enable signal 631. The enable signal 631 is generated by an enable circuit 630 receiving the PLL signal 603 and the trigger signal 604. The enable circuit 630 synchronizes the trigger signal 604 with the PLL signal 603. For example, the enable circuit 630 may synchronize the trigger signal 604 with a (rising/falling) edge of the PLL signal 603. Moreover, the enable circuit 630 is configured to determine the number of samples to be taken. Therefore, the enable circuit 630 may be configured to count the edges of certain type (e.g. falling or rising) of the PLL signal 603 and sets the enable signal 631 to a disabled state which disables the delay line 620 after a predetermined number is reached (e.g. after N signal edges are counted).

A synchronization circuit 640 synchronizes the PLL signal 603 and a signal 605 indicative of the PLL's state that is synchronized to the reference oscillation signal input into the PLL.

The outputs of the flip-flop circuits 610-1, 610-2, . . . , 610-N are supplied to a second set of N flip-flop circuits 650-1, . . . , 650-N which is clocked based on the output signal of the synchronization circuit 640. The synchronization circuit 640 together with the flip-flop circuits 610-1, 610-2, . . . , 610-N and the second set of flip-flop circuits 650-1, . . . , 650-N may be understood as a sampling circuit 660 according to the proposed technique. The outputs of the flip-flop circuits 610-1, 610-2, . . . , 610-N are synchronized to the reference clock domain (i.e. the reference oscillation signal input into the PLL) by means of the output signal of the synchronization circuit 640.

Figure 7:
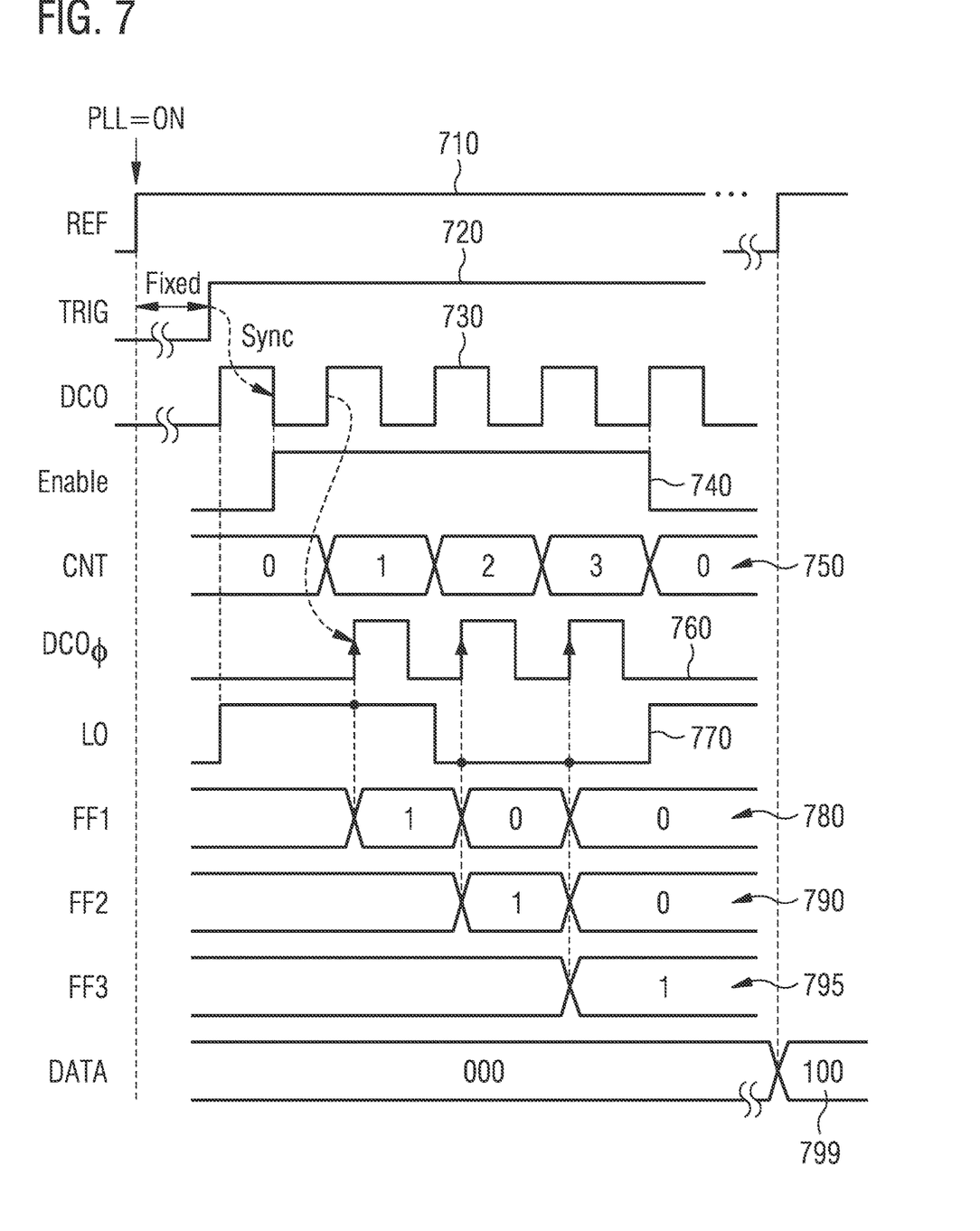
FIG. 7 illustrates a further example of a timing diagram.

This is exemplarily illustrated in the timing diagram of FIG. 7 for a frequency division by n=4. Here, N=n−1=3 flip-flop circuits are used for sampling the LO signal.

Again, signal course 710 illustrates that during a power-down/power-up cycle the PLL is switched on synchronously with a reference clock (i.e. synchronous with the reference oscillation signal input to the PLL).

After a fixed time period after switching the PLL on (during which the PLL locks to the reference oscillation signal), the trigger signal is generated synchronously with a signal edge of the PLL signal. For example, the trigger signal may be synchronized to a falling edge of the PLL signal as illustrated by signal courses 720 and 730, wherein signal course 720 represents the trigger signal and signal course 730 represents the PLL signal. Accordingly, the enable signal represented by signal course 740 goes high (indicating an active state of the delay line for delaying the PLL signal) in response to the first falling edge of the PLL signal while the trigger signal is high. The enable circuit, hence, starts to count the rising signal edges of the PLL signal while the enable signal is high as illustrated by course 750. When the count reaches its predetermined maximum of N=n−1=4−1=3 signal edges of the PLL signal, the count is set back to zero. When the count is set back to zero, the enable signal goes back to low.

Accordingly, the delay line delays only pulses of the PLL signal while the enable circuit counts from 1 to 3. Accordingly, the sampling signal comprises N=3 pulses (see signal course 760) so that N=3 samples of the LO signal are sampled by the flip-flop circuits (see signal course 770). Courses 780, 790 and 795 illustrate the sampled data of the LO signal for the three sample times. It is evident from courses 780, 790 and 795 that the three flip-flop circuits hold the sampled data after the enable circuit counted N=3 signal edges of the PLL signal. The corresponding output of the second set of flip-flop circuits is illustrated by course 799. It is evident from courses 710 and 799 that the output of the second set of flip-flop circuits is synchronized to the reference clock (since switching on the PLL is synchronized to the reference clock).

Figure 6:
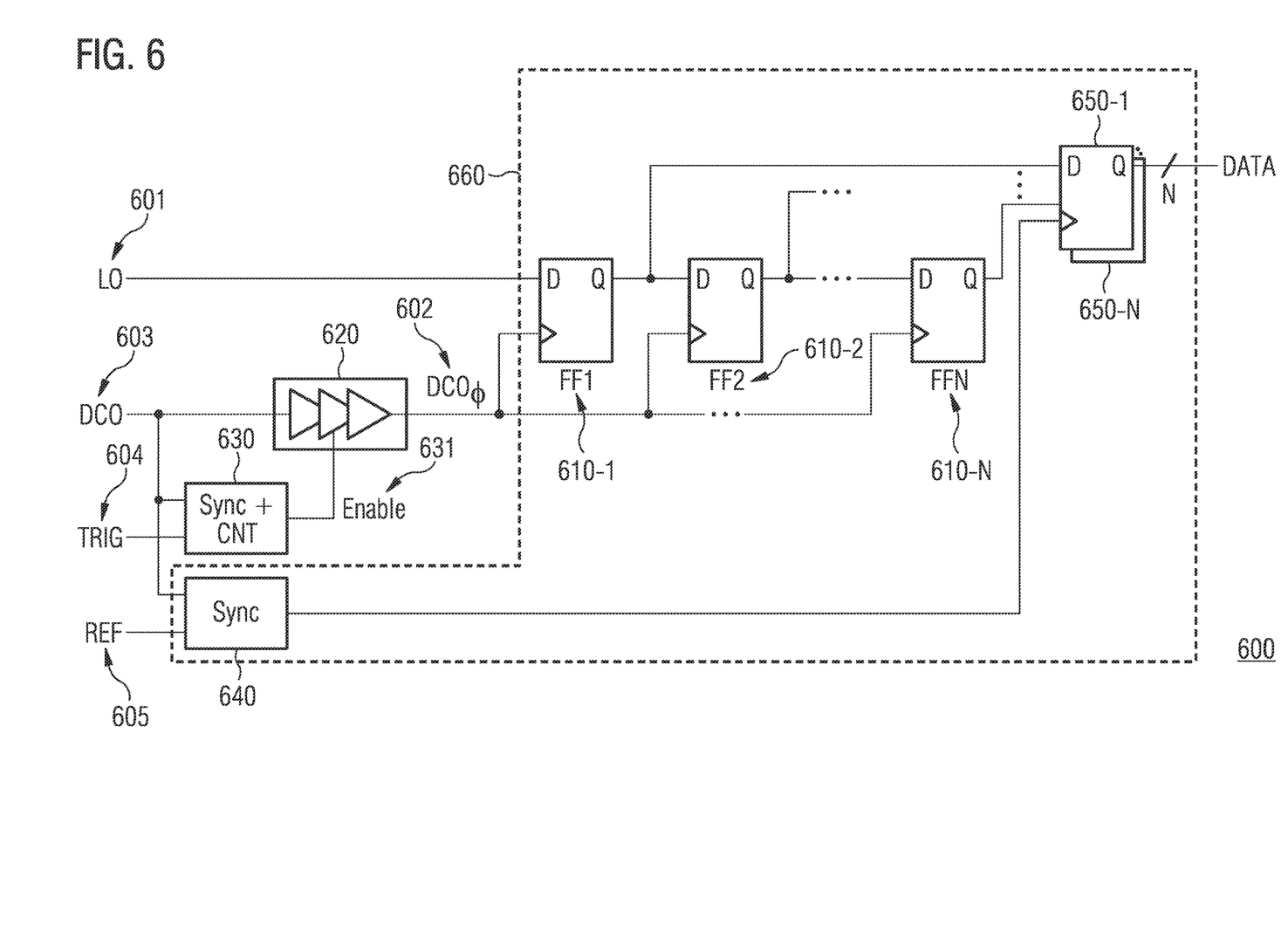
FIG. 6 illustrates an example of a sampling circuit.
Figure 8:
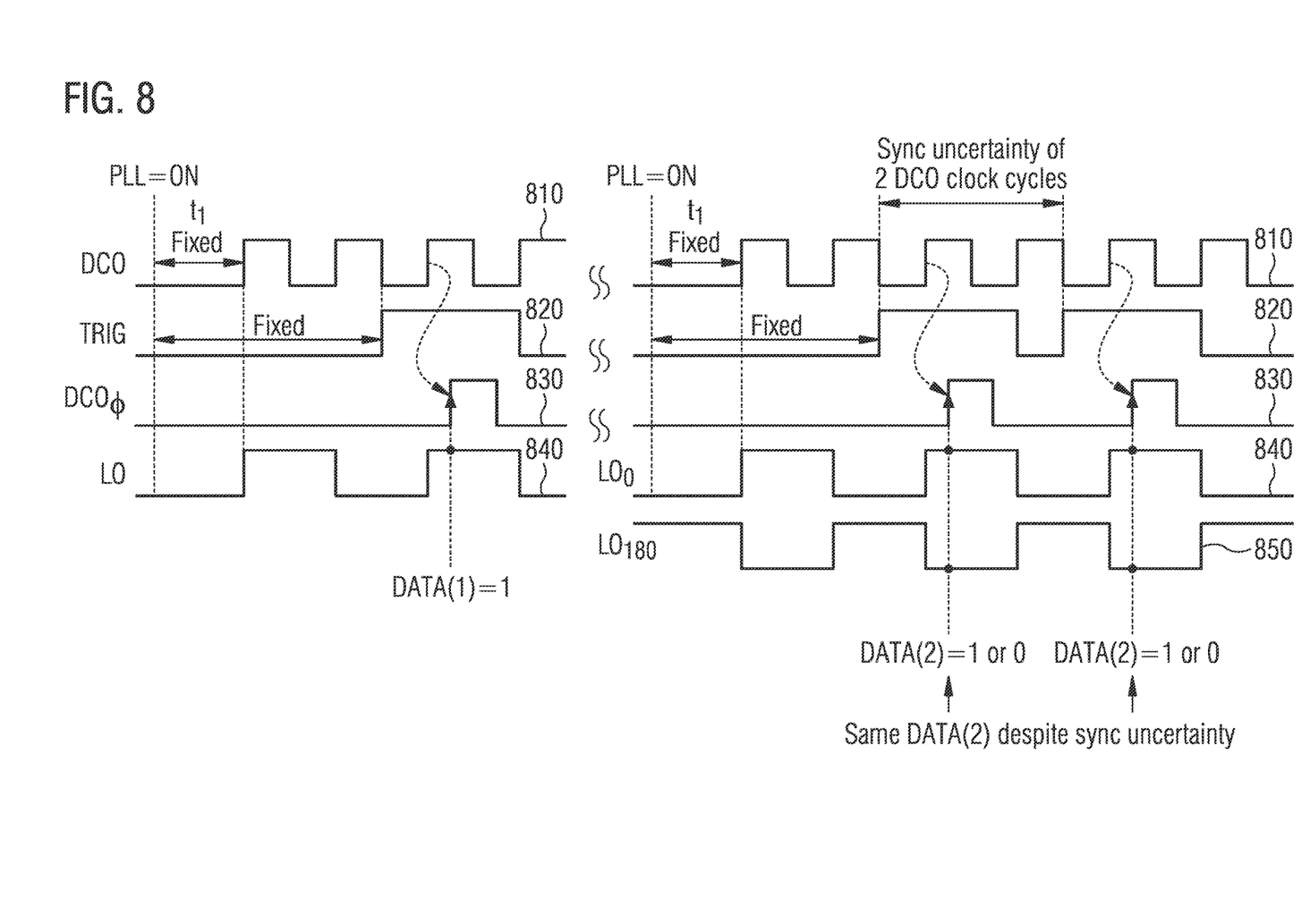
FIG. 8 illustrates a still further example of a timing diagram.

FIG. 8 illustrates an exemplary timing for a variation of the enable circuit 630 illustrated in FIG. 6. In the example of FIG. 8, the enable circuit 630 exhibits a synchronization uncertainty of two (or a multiple thereof) full clock cycles of the PLL signal with respect to the synchronization of the trigger signal 604 to the PLL signal 603. In FIG. 8, it is assumed that the frequency divider performs a frequency division by two for generating the LO signal from the PLL signal.

In the left part of FIG. 8, signal courses for a first power-down/power-up cycle are illustrated, whereas in the right part of FIG. 8 the corresponding signal courses for a second (subsequent) power-down/power-up cycle are illustrated.

For both cycles, the PLL is phase-locked after the fixed time $t_1$ after power-up of the PLL lapsed as illustrated by signal course 810. For the first cycle, the trigger signal is again generated synchronously with a signal edge of the PLL signal after a fixed time from switching the PLL on (see left part of signal course 820). For the second power-down/power-up cycle, the position of the pulse of the trigger signal may vary by two PLL clock cycles since the enable circuit 630 illustrated in FIG. 6 exhibits a synchronization uncertainty of two (or a multiple thereof) full clock cycles of the PLL signal with respect to the synchronization of the trigger signal 604 to the PLL signal 603. Accordingly, also the pulse in the sampling signal for controlling the flip-flop circuits may vary by two PLL clock cycles as illustrated in the right part of signal course 830. That is, the sampling time of the flip-flop circuits may vary by two PLL clock cycles.

However, it is evident from signal courses 840 and 850 representing the LO signal with and without phase shift that varying the sampling time of the flip-flop circuits by two PLL clock cycles does not change the sampling result for a frequency division by two so that phase changes of the LO signal may be correctly determined.

In general, for a frequency division by n, an uncertainty of n full clock cycles of the PLL signal may be allowed in the enable circuit 630 (i.e. the synchronization stage) for correct LO signal phase change detection. This robustness against clock uncertainty may relax the design of the synchronization stage.

From the foregoing description, it is evident that the proposed technique may be implemented in an area-efficient manner since proposed technique avoids area-expensive components like TDCs. Instead, the proposed technique may be implemented using a few flip-flop circuits and gates for sampling and synchronization. Further, the proposed technique may be readily scaled to an arbitrary number of frequency dividers with minimal area impact.

As described in the foregoing, the output of a frequency divider may be sampled using the frequency divider input at every power-up in some examples. The sampling is done at a fixed offset from the time when the PLL is turned on, which is synchronous with the reference clock. A phase change of the LO signal output by the frequency divider may be detected by comparing the sample values between two consecutive power-ups. For a divider-by-n, n−1 samples may be used.

Generally speaking, some examples of the present disclosure relate to a means for determining phase continuity of a LO signal generated using a frequency divider. The means comprises a means for determining at least one sample of the LO signal, and a means for determining information on the phase continuity using the at least one sample. As described above, the means for determining the at least one sample of the LO signal may be configured to sample the LO signal at a predetermined time after a PLL is switched on, the PLL generating a PLL signal input into the frequency divider.

Figure 9:
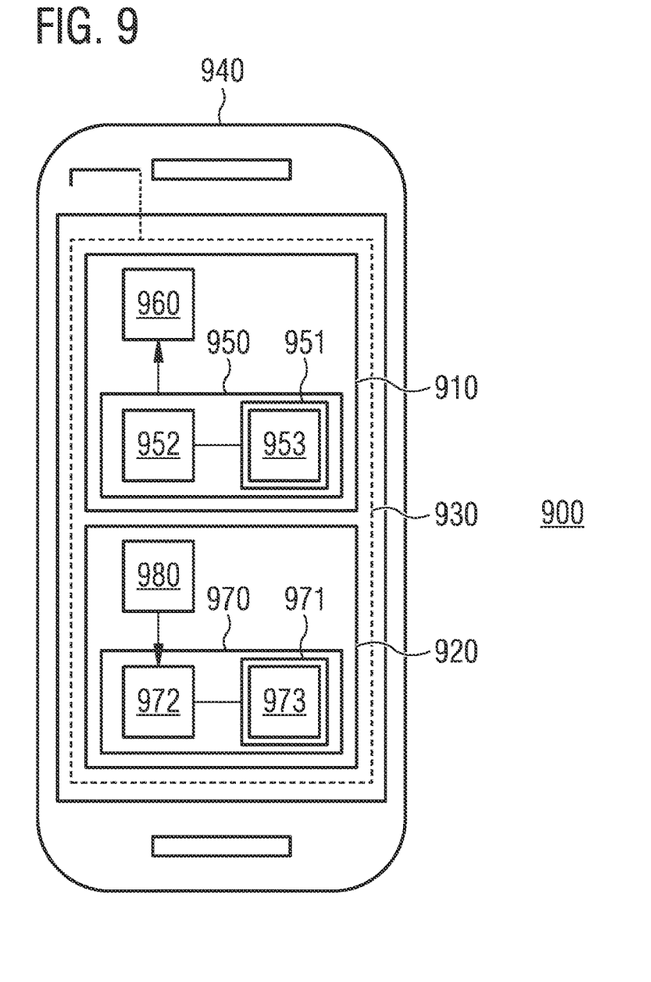
FIG. 9 illustrates an example of a mobile communications device comprising a circuit for determining phase continuity of a LO signal.

An example of an implementation using a circuit for determining phase continuity of a LO signal according to one or more aspects of the proposed architecture or one or more examples described above is illustrated in FIG. 9. FIG. 9 schematically illustrates an example of a mobile communications device 900 (e.g. mobile phone, smartphone, tablet-computer, or laptop) comprising a circuit for determining phase continuity of a LO signal according to an example described herein.

The mobile communications device 900 comprises at least one of a transmitter 910 and a receiver 920. For example, a transceiver 930 may comprise the transmitter 910 and the receiver 920. At least one antenna element 940 of the mobile communications device 900 may be coupled to the transmitter 910, to the receiver 920 or to the transceiver 930.

The transmitter 910 comprises a mixer circuit 950. The mixer circuit 950 comprises a LO signal generation circuit 951 according to one or more examples described above, and a mixer 952 for generating a RF signal based on a baseband signal and the LO signal of (generated by) the LO signal generator circuit 951. As described above, the LO signal generation circuit 951 comprises a circuit 953 for determining phase continuity of a LO signal according to an example described herein. A power amplifier 960 may be further coupled to an output of the mixer circuit 950 in order to amplify the generated RF signal before it is radiated to the environment by means of the at least one antenna element 940.

Similarly, the receiver 920 comprises another mixer circuit 970. The mixer circuit 970 comprises LO signal generation circuit 972 according to one or more examples described above, and a mixer 971 for generating a baseband signal based on a RF signal and the LO signal of the LO signal generator circuit 972. As described above, the LO signal generation circuit 972 comprises a circuit 973 for determining phase continuity of a LO signal according to an example described herein. A low noise amplifier 980 may be further coupled to an input of the mixer circuit 970 in order to amplify the RF signal received from the environment by means of the at least one antenna element 940 before it is down-converted by the mixer circuit 970.

To this end, a mobile communications device having a transmitter/receiver/transceiver with improved (reduced) power consumption and chip-area consumption may be provided.

Figure 10:
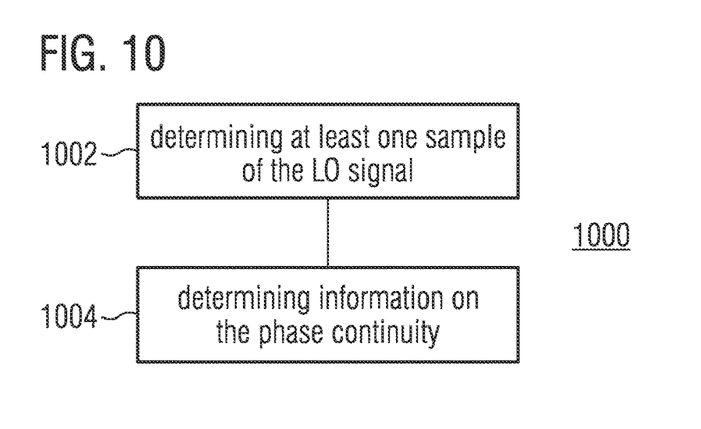
FIG. 10 illustrates a flowchart of an example of a method for determining phase continuity of a LO signal.

An example of a method 1000 for determining phase continuity of a LO signal generated using a frequency divider is illustrated by means of a flowchart in FIG. 10. The method 1000 comprises determining 1002 at least one sample of the local oscillator signal. Further, the method 1000 comprises determining 1004 information on the phase continuity using the at least one sample.

More details and aspects of the method are mentioned in connection with the proposed technique or one or more examples described above (e.g. FIGS. 1-9). The method may comprise one or more additional optional features corresponding to one or more aspects of the proposed technique or one or more examples described above.

Wireless communication circuits using circuits, transmitters or receivers according to the proposed technique or one or more of the examples described above may be configured to operate according to one of the $3^{rd}$ Generation Partnership Project (3GPP)-standardized mobile communication networks or systems. The mobile or wireless communication system may correspond to, for example, a Long-Term Evolution (LTE), an LTE-Advanced (LTEA), High Speed Packet Access (HSPA), a Universal Mobile Telecommunication System (UMTS) or a UMTS Terrestrial Radio Access Network (UTRAN), an evolved-UTRAN (eUTRAN), a Global System for Mobile communication (GSM) or Enhanced Data rates for GSM Evolution (EDGE) network, a GSM/EDGE Radio Access Network (GERAN). Alternatively, the wireless communication circuits may be configured to operate according to mobile communication networks with different standards, for example, a Worldwide Interoperability for Microwave Access (WIMAX) network IEEE 802.16 or Wireless Local Area Network (WLAN) IEEE 802.11, generally an Orthogonal Frequency Division Multiple Access (OFDMA) network, a Time Division Multiple Access (TDMA) network, a Code Division Multiple Access (CDMA) network, a Wideband-CDMA (WCDMA) network, a Frequency Division Multiple Access (FDMA) network, a Spatial Division Multiple Access (SDMA) network, etc.

The examples as described herein may be summarized as follows:

Example 1 is a method for determining phase continuity of a local oscillator signal generated using a frequency divider, comprising: determining at least one sample of the local oscillator signal; and determining information on the phase continuity using the at least one sample.

In example 2, determining the at least one sample of the local oscillator signal in the method of example 1 comprises sampling the local oscillator signal at a predetermined time after a phase-locked loop is switched on, the phase-locked loop generating a phase-locked loop signal input into the frequency divider.

In example 3, determining the at least one sample of the local oscillator signal in the method of example 2 comprises sampling the local oscillator signal at a fixed predetermined time interval after a signal edge of the phase-locked loop signal.

In example 4, the fixed predetermined time interval in the method of example 3 is shorter than a full cycle time of the phase-locked loop signal.

In example 5, determining information on the phase continuity in the method of example 1 comprises using the at least one sample with information on a reference sample.

In example 6, determining information on the phase continuity in the method of example 5 comprises determining that the local oscillator signal is phase continuous, if the at least one sample equals the reference sample.

In example 7, determining if the local oscillator signal is phase continuous in the method of example 5 or example 6 comprises saving the determined sample as an information on a further reference sample for a subsequent phase continuity determination.

In example 8, the method of any of examples 1 to 7 further comprises correcting the phase of the local oscillator signal if the local oscillator signal is not phase continuous.

In example 9, the method of any of examples 1 to 8 further comprises: determining a further sample of the local oscillator signal after a full cycle time of the phase-locked loop signal after the determination of the at least one sample; and determining information on the phase continuity using the further sample.

Example 10 is a circuit for determining phase continuity of a local oscillator signal generated using a frequency divider, comprising: a sampling circuit configured to determine at least one sample of the local oscillator signal; and an evaluation circuit configured to determine information on the phase continuity using the at least one sample.

In example 11, the sampling circuit in the circuit of example 10 is configured to sample the local oscillator signal at a predetermined time after a phase-locked loop is switched on, the phase-locked loop generating a phase-locked loop signal input into the frequency divider.

In example 12, the sampling circuit in the circuit of example 11 is configured to sample the local oscillator signal at a fixed predetermined time interval after a signal edge of the phase-locked loop signal.

In example 13, the fixed predetermined time interval in the circuit of example 12 is shorter than a full cycle time of the phase-locked loop signal.

In example 14, the evaluation circuit in the circuit of example 10 is configured to use the at least one sample with information on a reference sample.

In example 15, the evaluation circuit in the circuit of example 14 is configured to determine that the local oscillator signal is phase continuous, if the at least one sample equals the reference sample.

In example 16, the evaluation circuit in the circuit of example 14 or example 15 is configured to save the determined sample as an information on a further reference sample for a subsequent phase continuity determination.

In example 17, the circuit of any of examples 10 to 16 further comprises a circuit configured to correct the phase of the local oscillator signal if the local oscillator signal is not phase continuous.

In example 18, the sampling circuit in the circuit of any of examples 10 to 17 is further configured to determine a further sample of the local oscillator signal after a full cycle time of the phase-locked loop signal after the determination of the at least one sample, wherein the evaluation circuit is further configured to determine the information on the phase continuity using the further sample.

Example 19 is a local oscillator signal generation circuit, comprising: a phase-locked loop configured to generated a phase-locked loop signal; a frequency divider configured to receive the phase-locked loop signal and to divide the frequency of the phase-locked loop signal to generate a local oscillator signal; and a circuit for determining phase continuity according to any of examples 10 to 18.

In example 20, the circuit for determining phase continuity in the local oscillator signal generation circuit of example 19 is coupled to an output of the phase-locked loop and to an output of the frequency divider.

In example 21, the sampling circuit in the local oscillator signal generation circuit of example 20 is coupled to the output of the frequency divider.

Example 22 is a mixer circuit for a transmitter, comprising: a local oscillator signal generator circuit according to any of examples 19 to 21; and a mixer configured to generate a radio frequency signal based on a baseband signal and the local oscillator signal of the local oscillator signal generator circuit.

Example 23 is a transmitter comprising the mixer circuit according to example 22.

In example 24, the transmitter of example 23 further comprises a power amplifier coupled to an output of the mixer circuit.

Example 25 is a mixer circuit for a receiver, comprising: a local oscillator signal generator circuit according to any of examples 19 to 21; and a mixer configured to generate a baseband signal based on a radio frequency signal and the local oscillator signal of the local oscillator signal generator circuit.

Example 26 is a receiver comprising the mixer circuit according to example 25.

In example 27, the receiver of example 26 further comprises a low noise amplifier coupled to an input of the mixer circuit.

Example 28 is a transceiver comprising the transmitter according to any of examples 23 and 24, or the receiver according to any of examples 26 and 27.

Example 29 is a mobile communications device comprising the transmitter according to any of examples 23 and 24, the receiver according to any of examples 26 and 27, or the transceiver according to example 28.

In example 30, the mobile communications device of example 29 further comprises at least one antenna element coupled to the transmitter, to the receiver or to the transceiver.

Example 31 is a means for determining phase continuity of a local oscillator signal generated using a frequency divider, comprising: a means for determining at least one sample of the local oscillator signal; and a means for determining information on the phase continuity using the at least one sample.

In example 32, the means for determining the at least one sample of the local oscillator signal in the means of example 31 is configured to sample the local oscillator signal at a predetermined time after a phase-locked loop is switched on, the phase-locked loop generating a phase-locked loop signal input into the frequency divider.

The aspects and features mentioned and described together with one or more of the previously detailed examples and figures, may as well be combined with one or more of the other examples in order to replace a like feature of the other example or in order to additionally introduce the feature to the other example.

Examples may further be or relate to a computer program having a program code for performing one or more of the above methods, when the computer program is executed on a computer or processor. Steps, operations or processes of various above-described methods may be performed by programmed computers or processors. Examples may also cover program storage devices such as digital data storage media, which are machine, processor or computer readable and encode machine-executable, processor-executable or computerexecutable programs of instructions. The instructions perform or cause performing some or all of the acts of the above-described methods. The program storage devices may comprise or be, for instance, digital memories, magnetic storage media such as magnetic disks and magnetic tapes, hard drives, or optically readable digital data storage media. Further examples may also cover computers, processors or control units programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. Furthermore, all examples recited herein are principally intended expressly to be only for pedagogical purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

A functional block denoted as "means for . . ." performing a certain function may refer to a circuit that is configured to perform a certain function. Hence, a "means for s.th." may be implemented as a "means configured to or suited for s.th.", such as a device or a circuit configured to or suited for the respective task.

Functions of various elements shown in the figures, including any functional blocks labeled as "means", "means for providing a signal", "means for generating a signal.", etc., may be implemented in the form of dedicated hardware, such as "a signal provider", "a signal processing unit", "a processor", "a controller", etc. as well as hardware capable of executing software in association with appropriate software. When provided by a processor, the functions may be provided by a single dedicated processor, by a single shared processor, or by a plurality of individual processors, some of which or all of which may be shared. However, the term "processor" or "controller" is by far not limited to hardware exclusively capable of executing software, but may include digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:

1. A method for determining phase continuity of a local oscillator signal generated using a frequency divider, comprising:
   determining at least one sample of the local oscillator signal; and
   determining information on the phase continuity using the at least one sample,
   wherein determining the at least one sample of the local oscillator signal comprises sampling the local oscillator signal at a predetermined time after a phase-locked loop is switched on, the phase-locked loop generating a phase-locked loop signal input into the frequency divider,
   wherein determining the at least one sample of the local oscillator signal comprises sampling the local oscillator signal at a fixed predetermined time interval after a signal edge of the phase-locked loop signal, wherein the fixed predetermined time interval is shorter than a full cycle time of the phase-locked loop signal.

2. The method of claim 1, wherein determining information on the phase continuity comprises:
   using the at least one sample with information on a reference sample.

3. The method of claim 2, wherein determining information on the phase continuity comprises:
   determining that the local oscillator signal is phase continuous, if the at least one sample equals the reference sample.

4. The method of claim 2, wherein determining if the local oscillator signal is phase continuous comprises:
   saving the determined sample as an information on a further reference sample for a subsequent phase continuity determination.

5. The method of claim 1, further comprising:
   correcting the phase of the local oscillator signal if the local oscillator signal is not phase continuous.

6. The method of claim 1, further comprising:
   determining a further sample of the local oscillator signal after a full cycle time of the phase-locked loop signal after the determination of the at least one sample; and
   determining information on the phase continuity using the further sample.

7. A circuit for determining phase continuity of a local oscillator signal generated using a frequency divider, comprising:
   a sampling circuit configured to determine at least one sample of the local oscillator signal; and an evaluation circuit configured to determine information on the phase continuity using the at least one sample,
wherein the sampling circuit is configured to sample the local oscillator signal at a predetermined time after a phase-locked loop is switched on, the phase-locked loop generating a phase-locked loop signal input into the frequency divider,
wherein the sampling circuit is configured to sample the local oscillator signal at a fixed redetermined time interval after a signal edge of the phase-locked loop signal, wherein the fixed predetermined time interval is shorter than a full cycle time of the phase-locked loop signal.

8. The circuit of claim 7, wherein the evaluation circuit is configured to use the at least one sample with information on a reference sample.

9. The circuit of claim 8, wherein the evaluation circuit is configured to determine that the local oscillator signal is phase continuous, if the at least one sample equals the reference sample.

10. The circuit of claim 7, wherein the evaluation circuit is configured to save the determined sample as an information on a further reference sample for a subsequent phase continuity determination.

11. The circuit of claim 7, further comprising:
a circuit configured to correct the phase of the local oscillator signal if the local oscillator signal is not phase continuous.

12. The circuit of claim 7, wherein the sampling circuit is further configured to determine a further sample of the local oscillator signal after a full cycle time of the phase-locked loop signal after the determination of the at least one sample, and wherein the evaluation circuit is further configured to determine the information on the phase continuity using the further sample.

13. A local oscillator signal generation circuit, comprising:
a phase-locked loop configured to generated a phase-locked loop signal;
a frequency divider configured to receive the phase-locked loop signal and to divide the frequency of the phase-locked loop signal to generate a local oscillator signal; and
a circuit for determining phase continuity according to claim 7.

14. The circuit of claim 13, wherein the circuit for determining phase continuity is coupled to an output of the phase-locked loop and to an output of the frequency divider.

15. The circuit of claim 14, wherein the sampling circuit is coupled to the output of the frequency divider.

16. A mixer circuit for a transmitter, comprising:
a local oscillator signal generator circuit according to claim 13; and
a mixer configured to generate a radio frequency signal based on a baseband signal and the local oscillator signal of the local oscillator signal generator circuit.

* * * * *